(12) United States Patent
Hoege

(10) Patent No.: US 6,907,398 B2
(45) Date of Patent: Jun. 14, 2005

(54) COMPRESSING HMM PROTOTYPES

(75) Inventor: Harald Hoege, Gauting (DE)

(73) Assignee: Siemens Aktiengesellschaft, Munich (DE)

(*) Notice: Subject to any disclaimer, the term of this patent is extended or adjusted under 35 U.S.C. 154(b) by 563 days.

(21) Appl. No.: 09/946,783

(22) Filed: Sep. 6, 2001

(65) Prior Publication Data

US 2002/0046031 A1 Apr. 18, 2002

(30) Foreign Application Priority Data

Sep. 6, 2000 (DE) .......................... 100 43 946

(51) Int. Cl.[7] .............................................. G10L 15/14
(52) U.S. Cl. .................. 704/265; 704/232; 704/251; 704/238; 704/200; 704/270
(58) Field of Search ................. 704/256, 232, 704/251, 254, 236, 253, 200, 270, 238; 395/265, 241; 382/253, 187, 186; 706/16

(56) References Cited

U.S. PATENT DOCUMENTS

| | | | | |
|---|---|---|---|---|
| 5,535,305 A | * | 7/1996 | Acero et al. ................ 704/256 |
| 5,644,652 A | * | 7/1997 | Bellegarda et al. ......... 382/186 |
| 5,696,877 A | | 12/1997 | Iso |
| 5,732,388 A | | 3/1998 | Hoege et al. |
| 5,737,486 A | * | 4/1998 | Iso ............................. 704/232 |
| 5,758,021 A | * | 5/1998 | Hackbarth ................... 704/232 |
| 6,029,135 A | | 2/2000 | Krasle |
| 6,052,481 A | * | 4/2000 | Grajski et al. .............. 382/187 |
| 6,076,053 A | * | 6/2000 | Juang et al. ................ 704/236 |
| 6,151,414 A | * | 11/2000 | Lee et al. .................... 382/253 |
| 6,151,592 A | * | 11/2000 | Inazumi ....................... 706/16 |
| 6,178,398 B1 | * | 1/2001 | Peterson et al. ............. 704/232 |
| 2001/0014858 A1 | * | 8/2001 | Hirayama ................... 704/238 |

FOREIGN PATENT DOCUMENTS

| | | |
|---|---|---|
| DE | 19636739 C1 | 7/1997 |
| DE | 19719381 C1 | 1/1998 |
| DE | 69421354 T2 | 7/2000 |
| EP | 0 709 826 A1 | 5/1996 |
| EP | 0642117 B1 | 10/1999 |

OTHER PUBLICATIONS

Bourlard et al., "Auto–Association by Multilayer Perceptrons and Singular Value Decompositions", Biological Cybernetics, Springer Verlag, Berlin, 59. pp. 291–294, 1988.
Gopinath, "Maximum Likelihood Modeling with Gaussian Distributions for Classification", Proceedings of the 1998 IEEE International Conference on Acoustics, Speech and Signal Processing, ICASSP '98 (CAT No. 98CH36181), Seattle, WA, USA, 12–1, pp. 661–664, vol. 2, 1998, New York, NY, USA, IEEE USA.

* cited by examiner

Primary Examiner—David L. Ometz
Assistant Examiner—Jakieda R Jackson
(74) Attorney, Agent, or Firm—Staas & Halsey LLP

(57) ABSTRACT

A method is described for compressing the storage space required by HMM prototypes in an electronic memory. For this purpose prescribed HMM prototypes are mapped onto compressed HMM prototypes with the aid of a neural network (encoder). These can be stored with a smaller storage space than the uncompressed HMM prototypes. A second neural network (decoder) serves to reconstruct the HMM prototypes.

9 Claims, 2 Drawing Sheets

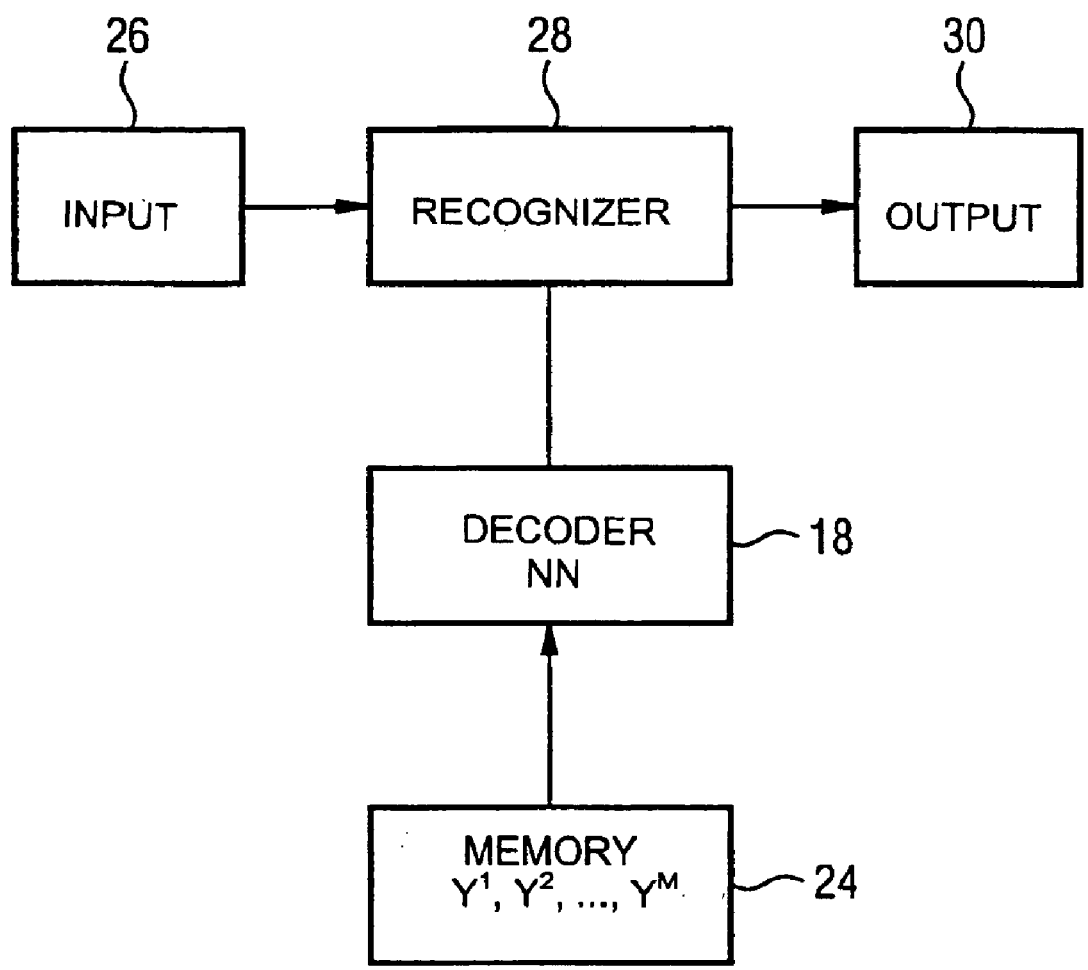

COMPRESSING HMM PROTOTYPES

CROSS REFERENCE TO RELATED APPLICATION

This application is based on and hereby claims priority to German Application No. 100 43 946.2 filed on Sep. 6, 2000 in Germany, the contents of which are hereby incorporated by reference.

BACKGROUND OF THE INVENTION

The invention relates to a method, a computer program and a data medium for compressing the storage space required by Hidden Markov Model "HMM" prototypes in an electronic memory, and to a system for automatic speech recognition.

Speech processing methods are disclosed, for example, in U.S. Pat. No. 6,029,135, U.S. Pat. No. 5,732,388, DE 19636739 C1 and DE 19719381 C1. In this case, naturally spoken speech has recently been described as a rule by what are termed Hidden Markov Models (HMMs) for the purpose of automatic speech recognition. In Hidden Markov Models, the term "emission probability" denotes the probability that the model belonging to class k emits or generates an actually spoken sound or an actually spoken sound sequence. Here, the class k can be, for example, a sound, a sound sequence, or a word or word sequence. An HMM prototype is the mean value of the associated emission probability distribution. They are obtained from speech recordings.

The prototypes are yielded from the recorded sound spectra after decomposition into individual spectral features and further mathematical transformations. They comprise a number of real numbers, the components and can therefore be regarded as vectors. The individual components are of different importance as regards the identification or assignment to certain sounds.

High-performance recognizers are dependent on Hidden Markov Models with many prototypes. The storage space required to store the prototypes generally rises in proportion to the number of prototypes. In the best current detectors, a prototype comprises 10 to 40 components. Each component is represented by 1 to 4 bytes.

Whole word recognizers decompose the words into arbitrary phonetic units for which prototypes are created. They manage with relatively few prototypes, for example, 1000 to 2000 in the case of a vocabulary of 10 to 50 words. Because of the small vocabulary, they are used for special applications such as number recognition or navigation in a menu.

Type-in recognizers assign prototypes exactly to individual sounds. They require 4000 to 10 000 prototypes, it being possible to assign 100 and more prototypes to each sound. The use of a type-in recognizer is advantageous in many applications, since the vocabulary to be recognized can be kept variable there.

The storage requirement for a type-in recognizer is on the order of magnitude of 40 to 1600 kilobytes. The available storage space is very limited, in particular in the case of mobile consumer terminals (for example, mobile phones, Palm Pilots, etc.); at present, it is substantially below 100 kilobytes, since the costs of the memory and the power loss caused by the memory constitute limiting factors. Methods which permit a drastic compression of the storage requirement are required in order to be able to implement high-performance type-in recognizers for consumer terminals, as well.

SUMMARY OF THE INVENTION

It is one possible object of the invention to permit the storage space required by HMM prototypes in an electronic memory to be reduced by compression.

The object may be achieved by a method, a computer program, and a data medium for compressing the storage space required by HMM prototypes in an electronic memory.

The computer program may be embodied as a commercial product in whatever form, for example, on paper, on a computer-readable data medium, distributed over a network, etc.

The first step is to prescribe HMM prototypes $X^j$, (j=1, . . . , J), with the components $X^j_k$, (k=1, . . . , N), J and N being natural numbers. As mentioned at the beginning, although not limited, typical values for J are 1000 or 10 000, also 100 000 in the case of extremely high-power recognizers. As mentioned above, N is generally between 10 and 40. The HMM prototypes $X^j$ are mapped (coded) onto compressed HMM prototypes $Y^j$, a (j=1, . . . , J) $Y^j$ having the components $Y^j_m$, (m=1, . . . , M), M being a natural number. The $Y^j$ are codings of the $X^j$ optimized toward low storage space.

There remains a need for a decoder which reconstructs the $X^j$ from the $Y^j$, at least approximately. A neural network (decoder) is provided for this purpose. The neural network maps (decodes) the $Y^j$ onto the reconstructed HMM prototypes $X^{ij}$ (j=1, . . . , J), with the components $X^{ij}_k$, (k=1, . . . , N). The $X^{ij}$ are the reconstructions of the $X^j$.

The compressed HMM prototypes $Y^j$ thus form an associative memory for the HMM prototypes $X^j$ together with the decoder.

In order to achieve an optimal compression of the HMM prototypes, the $Y^j$ and the decoder are selected in such a way
- that, on the one hand, the spacing between $X^j$ and $X^{ij}$ is minimized, and
- that, on the other hand, the storage space required for the $Y^J$ and the decoder in an electronic memory is minimized.

Using the compression according to one aspect of the invention, a recognizer, for example in a mobile phone, is required to store only the compressed HMM prototypes $Y^j$ and the structure and the weights of the decoder in the form of a neural network.

In order to permit flexible optimization of the coding, as well, an encoder can be provided for mapping (coding) the HMM prototypes $X^j$ onto the compressed HMM prototypes $Y^j$. In an advantageous development of one aspect of the invention, a neural network can be selected as the encoder.

Only binary numbers are suitable for the purpose of storing the compressed HMM prototypes $Y^J$. Consequently, the $Y^J_m$ generated are converted into binary numbers $YQ^j_m$, (j=1, . . . , J), (m=1, . . . , M). The $Y^j_m$ are real numbers if the encoder is designed in the form of a neural network. The interposition of a bit encoder is then to be recommended. If the coding is not carried out with the aid of a neural network, the direct mapping of the $X^j_k$ into binary numbers $Y^j_m$ can therefore be performed. The structure and parameters of the neural network operating as the decoder can be selected in such a way that the decoder can map the binary numbers $YQ^j_m$ onto the $X^{ij}_k$. Overall, the structure and parameters of the encoder, the bit encoder and the decoder are selected in such a way that the binary numbers $YQ^j_m$ have as few bits as possible, in order to achieve the goal of optimal compression and thus a low storage requirement. The $YQ^j_m$ has only 1 bit in the ideal case.

In the extreme case the $Y^j$ has only a single component, that is to say M=1. In addition, $YQ^j_1$, can basically be set to 1. The $Y^j$ themselves then need not be stored any longer. They then simply correspond in each case to an input node of the neural network of the decoder. Only the number J of the required HMM prototypes is prescribed for the neural network of the decoder in order to reconstruct the HMM prototypes.

The training of the neural network operating as the decoder is performed by the $Y^j$ at the inputs and $X^j$ at the outputs. The numbers $X^{ij}$ generated by the neural network are examined as to their distance from the $X^j$. In this case, the distance can be a Euclidean measure in the vector space of the $X^J$, for example. An improved decompression accuracy is achieved when the components with the higher ability to discriminate are weighted more heavily in order to determine the spacing between the $X^j$ and the $X^{ij}$. The ability to discriminate a component is the importance of this component for deciding on the assignment (classification) of a recorded sound to the HMM prototype to which the component belongs.

The object could possibly also be achieved, furthermore, by a system for automatic speech recognition which has a neural network for calculating speech patterns, for example HMM prototypes. Furthermore, the system has an input for a speech signal. As a rule, this is a transformed recording of a sound. In order to recognize the input speech signal, a recognizer uses the output values of the neural network as the speech pattern. The results of the recognizer are output via an output in the form of a signal which corresponds to the recognized speech signal. The system can be part of a mobile phone, a handheld computer, a microcomputer, a notebook, a computer or the like.

The system also includes permanent or removable storage, such as magnetic and optical discs, RAM, ROM, etc. on which the process and data structures of the present invention can be stored and distributed. The processes can also be distributed via, for example, downloading over a network such as the Internet.

If the compressed HMM prototypes $Y^j$ mentioned at the beginning are not each assigned immediately to an input node of the neural network operating as decoder, the system may also have a memory for storing compressed speech patterns $Y^j$ for example for storing compressed HMM prototypes. The $Y^j$ serve as inputs for the inputs of the neural network.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 3 shows a system for automatic voice recognition which uses compressed HMM prototypes.

DETAILED DESCRIPTION OF THE PREFERRED EMBODIMENT

Figure 1:
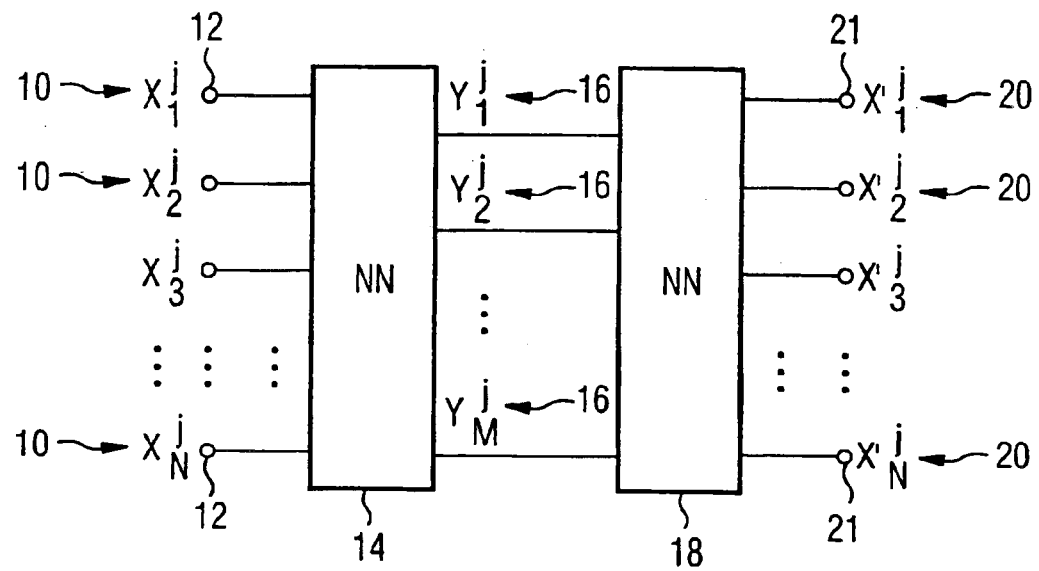
FIG. 1 shows a schematic of the cooperation of the encoder and decoder to compress HMM prototypes.

Reference will now be made in detail to the preferred embodiments of the present invention, examples of which are illustrated in the accompanying drawings, wherein like reference numerals refer to like elements throughout.

FIG. 1 shows an HMM prototype which is denoted by $X^j$, j=1, . . . J, J being a natural number. The components $X^j_1$, $X^j_2$ to $X^j_N$ of $X^j$ are denoted by the reference 10. N is also a natural number. The components are applied to inputs 12 of the neural network 14 denoted by NN. The neural network 14 operates as an encoder. It generates compressed HMM prototypes $Y^j$ j=1, . . . , J, J being the abovementioned natural number. $Y^j$ has the components $Y^j_1$, $Y^j_2$ to $Y^j_M$ M being a natural number. The components $Y^j_m$ are marked with the reference numeral 16. The components $Y^j_m$ generated by the neural network 14 are real numbers. FIG. 1 also shows a second neural network NN 18, which operates as a decoder. It reconstructs HMM prototypes $X^{ij}$ with the components $X^{ij}_1$, $X^{ij}_2$ to $X^{ij}_N$, which are denoted by the reference numeral 20, at the output nodes 21 of the neural network.

The basis of the compression method according to one aspect of the invention is coding and decoding based on neural networks 14, 18. Each HMM prototype $X^j$ is firstly subjected to encoding by the neural network 14. The HMM prototype $X^j$ is mapped onto a compressed HMM prototype $Y^j$. $X^j$ has N components; $Y^j$ has M components, idR M being substantially smaller than N, in order to achieve the goal of the compression.

The compressed HMM prototypes in the form of the $Y^j$ can be stored in a space-saving fashion in an electronic memory. Carrying out speech recognition requires reconstruction of the original HMM prototypes $X^j$. This is performed with the aid of the neural network 18. The compressed HMM prototypes $Y^j$ are mapped onto reconstructed HMM prototypes $X^{ij}$ with the aid of the neural network 18.

FIG. 1 therefore shows an autoassociative network or an associative memory.

Figure 2:
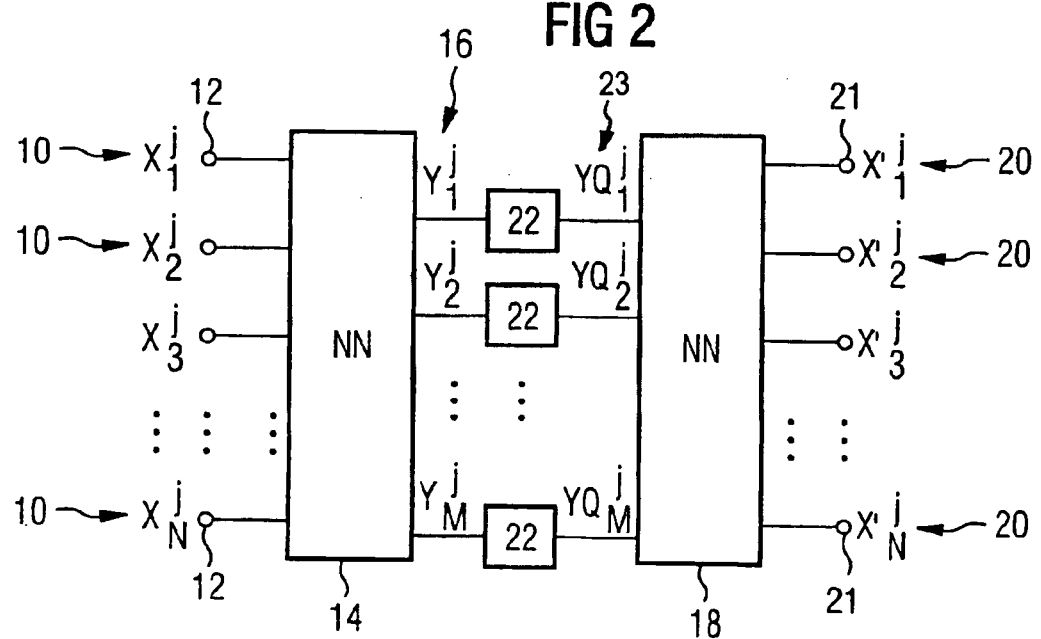
FIG. 2 shows an illustration in accordance with FIG. 1 including bit encoders.

Popular neural networks such as the neural network 14 supply as output real numbers for the components of the compressed HMM prototypes $Y^j_m$. Real numbers are not suitable for storing in an electronic memory. Consequently, there is also connected downstream of the encoder 14 a bit encoder 22 (see FIG. 2) which converts the real values $Y^j_m$ into values $YQ^j_m$. The bit encoder does not carry out simple analog-to-digital conversion. Rather, it can be used to select suitably which bit combination is to be assigned to which real value, and how many bits are to be used.

The neural network 18 preferably used for the decoding is a multi-layer perceptron (MLP), a layer-oriented feed forward network with a suitable intermeshing between the individual layers. The sigmoid function $S_c(x)$ or $\tanh(x)$ is used as activation function. A number of variable parameters must be selected to be sufficiently large for a high decoding accuracy. This can always be achieved by suitable selection of a number of layers, or by a suitable number of neurons in the hidden layer(s). On the other hand a large number of neurons or hidden layers increases the requisite storage space and the computer power required for decoding. In the preferred exemplary embodiment, a single hidden layer is therefore used for the neural network.

The neural network 14 for encoding can be selected with any desired degree of complexity, since it need not be stored in the memory location to be minimized.

In addition to the minimization of the storage requirement, the deviations between the $X^j$ and the $X^{ij}$ should be kept as small as possible. Consequently, when training the neural network 18, a suitable distance between $X^j$ and $X^{ij}$ is selected as optimization criterion. In this case, the distance can be, for example, a Euclidean measure in the vector space of $X^j$, that is to say $$\|X^j - X'^j\| = \sum_{k=1}^{N}(X_k^j - X_k'^j)^2$$

Better decompression accuracy is achieved when the components with the higher ability to discriminate are more strongly weighted for the purpose of determining the distance between the $X^j$ and $X'^j$. The ability to discriminate a component is the importance of this component for the decision on the assignment (classification) of a recorded sound to the HMM prototype to which the component belongs. The actual and final goal of the decoder is associated not with the fact the X' effectively approximates the values of X, but with the fact that the error rate of the recognizer in the case of automatic speech recognition using the reconstructed HMM prototypes $X'^j$ rises as little as possible by comparison with the uncoded HMM prototypes $X^j$.

In each case of the use of "linear discriminant analysis" (LDA) for generating HMM prototypes starting from the recorded speech data, the components $X^j_1, \ldots, X^j_N$ are arranged according to their ability to discriminate. Consequently, a good approximation of the components for the values $X^j_k$ is more important with a small index k than for large indices k. In the preferred exemplary embodiment, it is the functions:

$$\|X^j - X'^j\| = \sum_{k=1}^{N} a_k(X_k^j - X_k'^j)^2; a_1 \geq a_2 \geq \ldots \geq a_{N-1} \geq a_N > 0,$$

which are used as distance, ak assuming falling values with rising k.

The training of the neural network 18 operating as the decoder is performed by the $Y^j$ at the inputs and the $X^j$ at the outputs. The $X'^j$ generated by the neural network are examined as to their distance from the $X^j$ and the weights are suitably varied in order to reduce the distances on average.

After the optimization, the compressed HMM prototypes $Y^j$ can be stored together with the structure and the weights, determined during training, of the neural network as well as the indices thereof.

If a relatively simple neural network 18 is used for decoding, information must be stored via the HMM prototypes $X^j$ essentially in the compressed HMM prototypes $Y^j$. In the case of 4000 to 10 000 HMM prototypes $X^j$ of a type-in recognizer, the same number of compressed HMM prototypes $Y^J$ is obtained. However, these now have fewer components, for example, only 5 to 20 components per prototype, since M can be smaller than N. Furthermore, each of these components has fewer bits, for example only 2 to 16 bits. The result of this is a storage requirement of only 5 to 400 kilobytes for the compressed HMM prototypes.

The storage requirement for the neural network is, by contrast, of virtually no importance for a network with only one hidden layer.

Overall, compression may reduce the storage requirement by a factor of 2 to 4 using the method described.

FIG. 3 shows a system for automatic speech recognition, for example in a mobile phone. It contains a memory 24 for storing compressed HMM prototypes $Y^1$ to $Y^j$. The system also has a neural network 18 for decoding the compressed HMM prototypes, that is to say for reconstructing HMM prototypes. Also shown in FIG. 3 is an input 26 for a speech signal, as a rule a transformed recording of the sound. In order to recognize the input speech signal, a recognizer 28 uses as a prototype the output values of the neural network 18. The results of the recognizer 28 are output via an output 30 in the form of a signal which corresponds to the recognized speech signal.

The invention has been described in detail with particular reference to preferred embodiments thereof and examples, but it will be understood that variations and modifications can be effected within the spirit and scope of the invention.

What is claimed is:

1. A method for compressing the storage space required by Hidden Markov Model (HMM) prototypes in an electronic memory, comprising:
   prescribing HMM prototypes;
   mapping the HMM prototypes onto compressed HMM prototypes using a first ancoder; and
   converting the compressed HMM prototypes into binary numbers using a second encoder, the second encoder being a bit encoder, the HMM prototypes being converted to binary numbers such that the binary numbers having as few bits as possible, and
   compressed HMM prototypes and the binary numbers being formed in such a way that a neural network can map the binary numbers onto reconstructed HMM prototypes, and the spacing between the HMM prototypes and the reconstructed HMM prototypes is minimized.

2. The method as claimed in claim 1, wherein the first encoder is a second neural network.

3. The method as claimed in claim 1, wherein the reconstructed HMM prototypes with the higher ability to discriminate are weighted more heavily in order to determine the spacing between the HMM prototypes and the reconstructed HMM prototypes.

4. The method as claimed in claim 2, wherein the reconstructed HMM prototypes with the higher ability to discriminate are weighted more heavily in order to determine the spacing between the HMM prototypes and the reconstructed HMM prototypes.

5. The method as claimed in claim 1 wherein
   the binary numbers have as few bits as possible such that the binary numbers occupy fewer bits than binary numbers obtained from a direct mapping.

6. A system for automatic speech recognition, comprising:
   a first encoder to map Hidden Markov Model (HMM) prototypes onto compressed HMM prototypes;
   a second encoder to convert the compressed HMM prototypes into binary numbers, the second encoder being a bit encoder;
   an electronic memory storage space to store the compressed HMM prototypes;
   a neural network to calculate speech patterns and to map the compressed HMM prototypes onto reconstructed HMM prototypes by mapping the binary numbers onto reconstructed HMM prototypes;
   an input to calculate a speech signal;
   a recognizer to recognize the input speech signal, the recognizer using the speech patterns calculated by the neural network ; and
   an output to produce a signal which corresponds to the input speech signal, wherein
   the compressed HMM prototypes and the neural network are chosen to minimize the spacing between the HMM prototypes and the reconstructed HMM prototypes, and
   the structure and parameters of the encoders and of the neural network are selected in such a way that the binary numbers have as few bits as possible.

7. The system as claimed in claim 6, wherein the memory stores compressed speech patterns calculated by the neural network.

8. The system as claimed in claim 6, wherein the neural network comprises a single hidden layer.

9. A computer readable storage medium storing a program to control a computer to perform a process for compressing the storage space required by Hidden Markov Model (HMM) prototypes, the process comprising:

prescribing HMM prototypes ($X^j$) being prescribed;

mapping the HMM prototypes onto compressed HMM prototypes using a first encoder; and converting the compressed HMM prototypes into binary numbers using a second encoder, the second encoder being a bit encoder, the HMM prototypes being converted to binary numbers such that the binary numbers having as few bits as possible, and the compressed HMM prototypes and the binary numbers being formed in such a way that the neural network can map the binary numbers onto reconstructed HMM prototypes, and the spacing between the HMM prototypes and the reconstructed HMM prototypes is minimized.

* * * * *

UNITED STATES PATENT AND TRADEMARK OFFICE
CERTIFICATE OF CORRECTION

PATENT NO. : 6,907,398 B2
APPLICATION NO. : 09/946785
DATED : June 14, 2005
INVENTOR(S) : Harald Hoege It is certified that error appears in the above-identified patent and that said Letters Patent is hereby corrected as shown below:

On The Title Page, Col. 2 (56) References Cited, Other Publications, line 2, change "Decompositions" to -- Decomposition --

Column 6, line 15, change "ancoder" to --encoder--

Column 6, line 20, insert --the-- before "compressed"

Signed and Sealed this

First Day of August, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,907,398 B2 |
| APPLICATION NO. | : 09/946783 |
| DATED | : June 14, 2005 |
| INVENTOR(S) | : Harald Hoege |

It is certified that error appears in the above-identified patent and that said Letters Patent is hereby corrected as shown below:

On The Title Page, Col. 2 (56) References Cited, Other Publications, line 2, change "Decompositions" to -- Decomposition --

Column 6, line 15, change "ancoder" to --encoder--

Column 6, line 20, insert --the-- before "compressed"

This certificate supersedes Certificate of Correction issued August 1, 2006.

Signed and Sealed this

Twelfth Day of September, 2006

JON W. DUDAS
*Director of the United States Patent and Trademark Office*